United States Patent [19]
Sohda et al.

[11] Patent Number: 5,283,440
[45] Date of Patent: Feb. 1, 1994

[54] ELECTRON BEAM WRITING SYSTEM USED IN A CELL PROJECTION METHOD

[75] Inventors: Yasunari Sohda, Hachioji; Hideo Todokoro, Tokyo; Norio Saitou, Iruma; Haruo Yoda; Hiroyuki Itoh, both of Katsuta; Hiroyuki Shinada, Chofu; Yoshinori Nakayama, Sayama; Shinji Okazaki, Urawa, all of Japan

[73] Assignee: Hitachi, Ltd., Tokyo, Japan

[21] Appl. No.: 770,527

[22] Filed: Oct. 3, 1991

[30] Foreign Application Priority Data

| Oct. 5, 1990 | [JP] | Japan | 2-266206 |
| Nov. 21, 1990 | [JP] | Japan | 2-313988 |
| Feb. 1, 1991 | [JP] | Japan | 3-011916 |
| Feb. 27, 1991 | [JP] | Japan | 3-031228 |

[51] Int. Cl.$^5$ .............................. H01J 37/30
[52] U.S. Cl. .................. 250/492.2; 250/492.1; 250/492.22
[58] Field of Search ............ 250/492.2 R, 492.22, 250/492.23, 396 R, 397, 398, 492.1

[56] References Cited

U.S. PATENT DOCUMENTS

| 4,393,312 | 7/1983 | Collier et al. | 250/492.2 |
| 4,728,797 | 3/1988 | Gotou et al. | 250/492.2 |
| 5,047,646 | 9/1991 | Hattori et al. | 250/396 R |

FOREIGN PATENT DOCUMENTS 59-169131 9/1984 Japan .
62-21216 1/1987 Japan .

OTHER PUBLICATIONS

3rd Microprocess Conference Jul. 16–19, 1990, Digest of Papers, "Electron Beam Direct Writing Technology for 64-Mb DRAM LSIs", F., Murai et al, pp. 172–173.

*Primary Examiner*—Jack I. Berman
*Assistant Examiner*—James Beyer
*Attorney, Agent, or Firm*—Fay, Sharpe, Beall, Fagan, Minnich & McKee

[57] ABSTRACT

An electron beam writing system is used in variable shaping and cell projection methods to produce LSI and reticles. In the cell projection method, the beam is deflected to define a writing position. In the time it takes to define the writing position, an operation of forming the beam is concluded, which operation includes the deflection of the beam to select a cell graphic, re-deflection for correcting the origin position of the written graphic, astigmatism correction of the written graphic, and focus correction for reducing the Coulomb effect. An electrostatic deflector is used as the deflector for the cell graphic selection. The arrangement of graphics includes a square aperture centrally located with a group of cell projection apertures positioned adjacent two sides of the square aperture.

10 Claims, 18 Drawing Sheets

F I G. 1
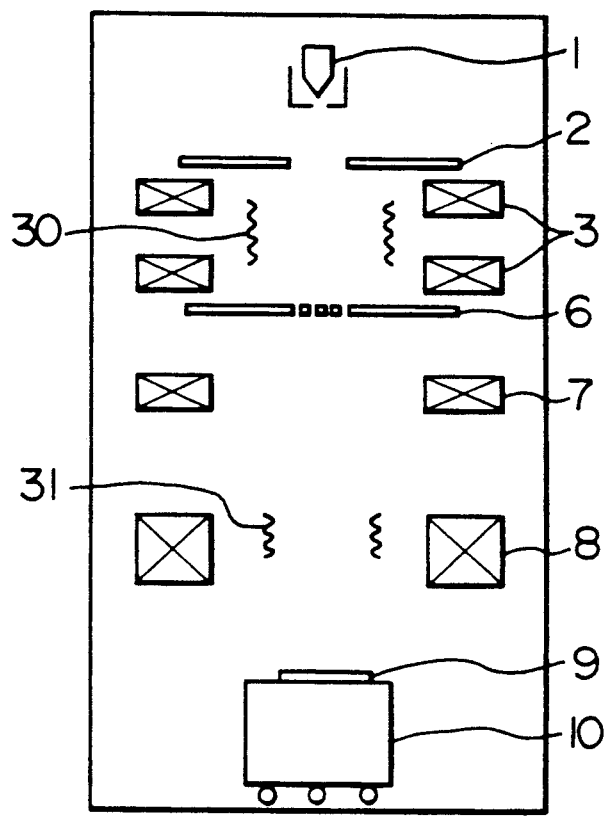
F I G. 2
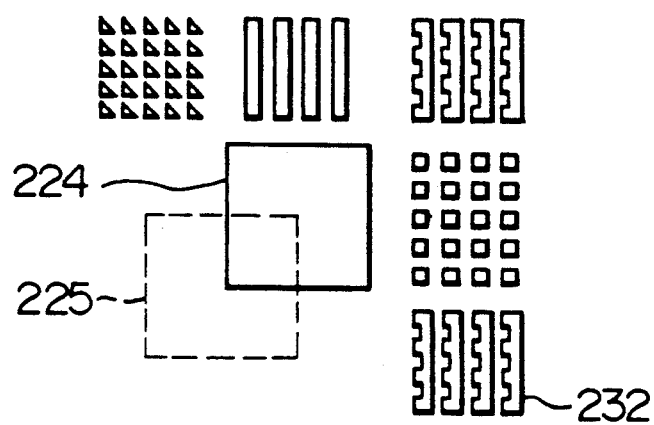

101 — DEFLECTOR FOR SHAPING DEFLECTION

102 — DEFLECTOR FOR GRAPHIC SECTION

3 --- ADJUSTMENT MARK PATTERN a) CASE OF DIFFERENT MAGNIFICATION c) OPTIMUM CASE b) CASE OF DIFFERENT ROTATIONS

F I G. 21
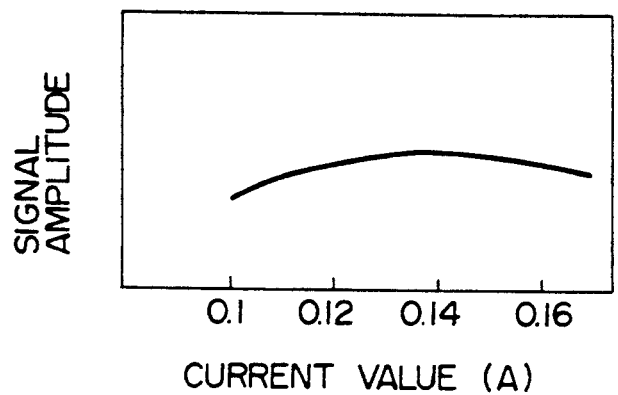
F I G. 22
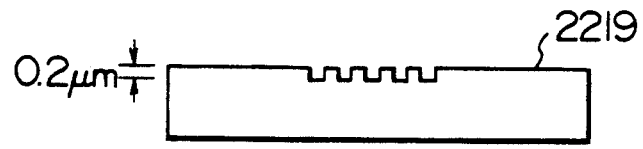
F I G. 23
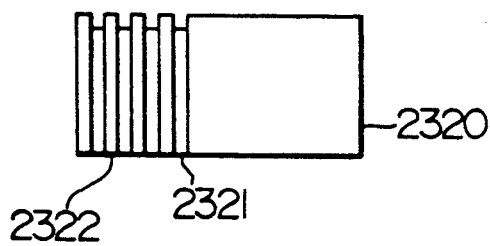
F I G. 24
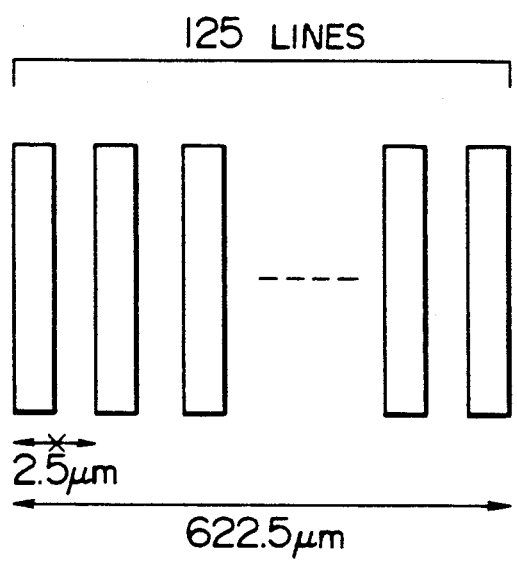

F I G. 30
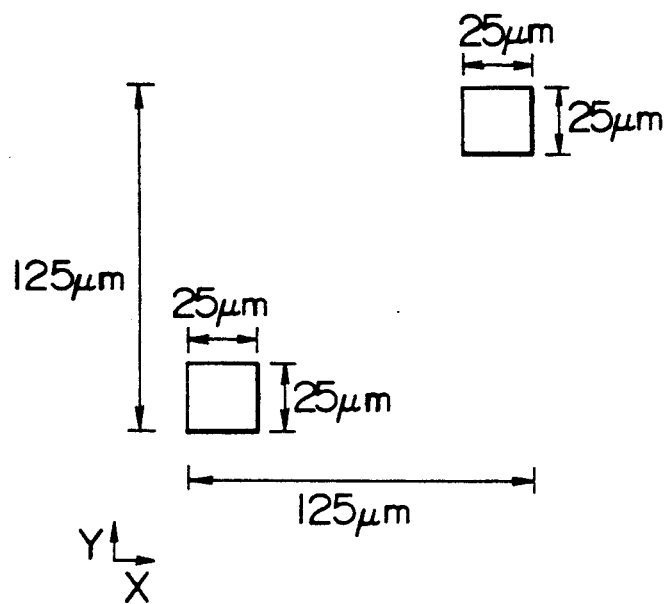
F I G. 31
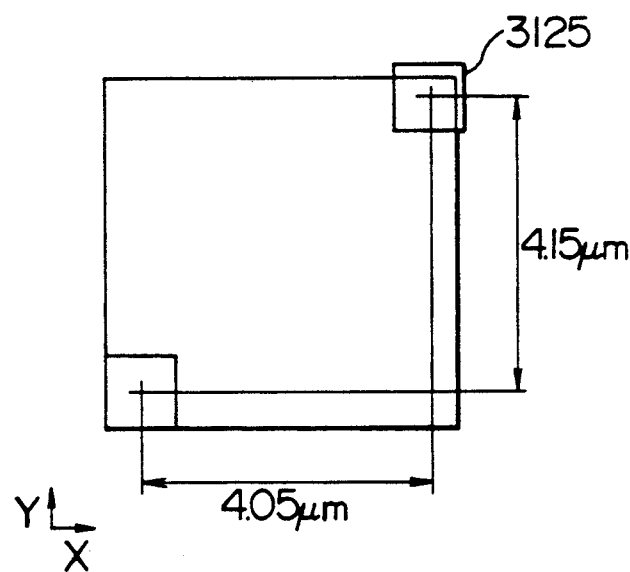
F I G. 32
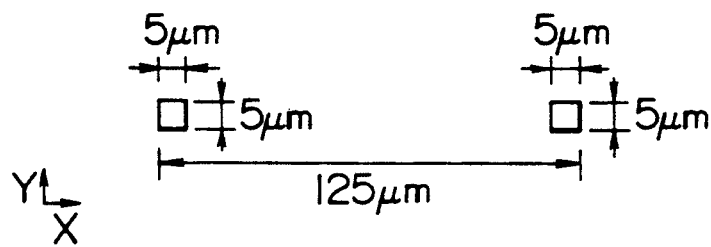

ELECTRON BEAM WRITING SYSTEM USED IN A CELL PROJECTION METHOD

BACKGROUND OF THE INVENTION

The present invention relates to an electron beam writing system, and more particularly to an electron beam writing system in a shaped electron beam projection method.

In the previously known variable shaping type of an electron beam writing device, the shape of the square to be written was changed for each shot as disclosed in JP-A-62-21216. The shape and size of the projected square image were adjusted by changing the amount of beam shaping deflection as described in F. Murai et al. "Digest of Papers 3rd Microprocess Conference (1990)" pp. 172-173.

On the other hand, in recent years, the possibility of providing an electron beam writing system in a cell projection method which projects electron beams using an aperture of not only a square but also of other specific shapes has been studied. More specifically, in JP-A-59-169131, a method is disclosed of repeatedly providing the electron beam writing system with a function of cell projection in such a manner that the electron beam is selectively projected through an aperture for cell projection formed adjacently to the conventional beam shaping square aperture by means of a deflector.

SUMMARY OF THE INVENTION

An object of the present invention is to realize a high speed and high reliability in a shaped electron beam projection system which can adopt both the conventional variable shaped beam and the cell projection method.

First, an explanation will be given of the realization of high speed.

In recent years, an electron beam writing system in a cell projection method which can write a complicate graphic or figure in one shot has been proposed. An arrangement of the electron beam writing system in a cell projection method is shown in FIG. 1. In FIG. 1, the image of a first aperture 2 is converged on a second aperture 6. The overlapped image is then exposed on a wafer 9 through a reduction lens 7 and a deflector lens 8. However, this method has the following defects. In this method, as shown in FIG. 2, a graphical aperture 232 for cell projection is arranged around a square aperture for forming a variable shaped beam 224 so that the image 225 of the first aperture is required to be more largely deflected than before (only for a variable shaped beam) for selection of graphics. An increase in the amount of deflection makes the deflection setting time slower than before. Namely, it takes a longer time to determine the shape of the electron beam. Further, as described later, this method also requires operations such as re-deflection for correcting the origin position of the written graphic, astigmatism correction of the written graphic, focus correction for reducing the Coulomb effect and, computation of the change in the correction value for deflection distortion in a deflection lens. The time required for these operations must be considered.

For the reasons described above, if the shape of the graphic is changed for each shot, exposure of the resist will start before the graphic has been selected. This makes it impossible to carry out the writing in accordance with the data prepared previously. If the shot cycle becomes longer to avoid this, the throughput will decrease. It should be noted that no proposal has ever been made for a method of defining the relationship between the selection of a graphic in a cell projection method and the deflection of determining a writing position. Accordingly, a first object of the present invention is to solve the problems described above, and provide an arrangement of the writing system which can realize the high speed and high reliability of the cell projection method and its use.

In accordance with the present invention, a deflector for determining a writing position is provided which operates during the same deflection time as the time required to form a graphic beam, or the deflection time longer than the latter. The time required to form the graphic beam is defined by the longest operation time among the operation time of the deflector used to select the graphic of an aperture and the operation time attendant to the graphic selection. In this case, the operation of forming the graphic beam, which includes both the selection time and the attendant operations time, by the writing system is carried out concurrently with operation of the deflector for determining the writing position, which deflection time is equal to or longer than the time required to form the graphic beam.

The operations to be performed attendantly to the graphic selection include re-deflection for correcting the origin position of the written graphic, astigmatism correction of the written graphic, and focus correction for reducing the Coulomb effect. Also, computation of the change in the correction value for deflection distortion in a defection lens should be carried out prior to the graphic selection. Then, the amount of correction in the focus correction is defined by the opening rate of an aperture. The correction value for deflection distortion is determined by correcting the deflection distortion using marks at the same height and two or more apertures with different opening rates, and through polynomial approximation of the opening rate in accordance with the opening rate of the aperture selected. Additionally, the opening rate may be previously registered in a control device or may be calculated from the secondary electron or back-scattered electron generated when the aperture is irradiated with an electron beam.

In accordance with the method as described above, selection of a graphic and the operations attendant thereto can be accomplished within the deflection time without reducing the accuracy of the writing position and the written graphic. Also, several kinds of operations can be concurrently performed so that the time required to form the graphic beam does not appear specifically, thus permitting efficient writing to be realized.

The respective operations will be explained below.

In selecting a graphic, the electron beam becomes much farther from an axis so that attendant astigmatism occurs. Therefore, in order to realize the writing with good resolution, it is desired to make astigmatism correction corresponding to the deflection position of the graphic selection.

The graphic used in the cell projection has a minute feature size that covers a large area. On the other hand, for the variable shaped beam, the larger the size of the graphic, the larger the entire area. Therefore, the cell projection method has a larger rate of the Coulomb effect for the size of the graphic than the variable shaped beam. Thus, in the cell projection method, it is particularly important to correct the Coulomb effect through a focus correction.

Meanwhile, the value of deflection distortion on the surface of a wafer varies due to the change in the trajectory of the beam in selecting the graphic. Its value increases particularly when a focus correction is used for reducing the Coulomb effect. Therefore, varying the correction value for deflection distortion when selecting the graphic is effective for improving the accuracy of the writing position. This operation is executed completely on a computer so that it can be carried out concurrently with the writing precedent to selecting a graphic.

The above Coulomb effect depending on the amount of current, i.e. the opening rate of an aperture graphic. Therefore, the focus correction is made in accordance with the opening rate. By knowing the opening rate of each graphic, the correction can be made with high accuracy. This is true of the correction value for the deflection distortion attendant to the focus correction. Since the aperture rate is in a simple correlation with these correction values, the correction value for a certain opening rate can be obtained by interpolating several correction values for the opening rates previously measured.

An explanation will be further given of the means and method for realizing the high speed writing. Conventionally, an electron beam is projected on the aperture in a cell projection method using one or plural magnetic deflectors. This method, however, requires a relatively long settling time for deflection of the electron beam because of using the magnetic deflector. Therefore, in using several graphics, the throughput is lowered because of the low speed of the deflection.

Accordingly, the second object of the present invention is to improve using throughput by the high speed electron beam deflection.

In order to attain this object, an electrostatic deflector for shaping deflection and another electrostatic deflector for graphic selection are provided. Further, a divided electrostatic deflector structure as shown in FIG. 10 is adopted in order to make the deflection centers of both deflectors coincident.

More specifically, the deflector for a variable shaped beam, which is required to operate at a low voltage for a high speed operation, cannot provide a large amount of deflection. However, high voltage electrostatic deflectors can provide an amount of deflection substantially equivalent to the magnetic deflector at a lower speed than the deflector for a variable shaped beam, but at a higher speed than the magnetic deflector. Further, if the deflection centers of both deflectors are made coincident, the deflection will be made substantially by a single deflector, thus simplifying the trajectory of the electron beam. The electro-static deflectors cannot be used in an overlapped manner so that as shown in FIG. 10, the deflection center of one deflector (in this case, a deflector for graphic selector 102) divided into two parts is caused to be coincident to that of the other deflector (in this case, a deflector for shaping deflection). Additionally, the two part deflector causes the electron beam to depart more from its axis in its rear stage deflection plate. In order to reduce the deflection distortion thus generated, the distance between the deflection plates of the two part deflector is preferably made larger than that of the central deflector.

Now, an explanation will be given of means for realizing the high reliability in the shaped electron beam projection system adopting the cell projection method.

The cell projection method intends to project an electron beam onto the entire surface or a part thereof an aperture with a complicated shape to provide an electron beam with a complicated shape. In the cell projection, the graphic of the electron beam having permeated through the aperture having a fixed pattern will be fixed so that unlike the variable shaped beam, the size of the permeated electron cannot be adjusted by the amount of shaping deflection.

A fluctuation in the graphic size particularly leads to deterioration in the position accuracy of a writing pattern. The fluctuation in the graphic size is desired to be restricted to 0.05 μm or less in sub-micron writing and to 0.02 μm or less in deep sub-micron writing. To this end, the magnification factor must be adjusted with high accuracy.

Accordingly, the third object of the present invention is to provide an arrangement of the electron beam writing system which can accurately adjust the size of a graphic pattern in the electron beam writing system in a cell projection method.

In order to attain the above third object, in accordance with the present invention, the electron beam writing system is provided with means for providing the information relative to the magnification factor of a lens, and means for adjusting the magnification factor of the lens. The means for providing the information relative to the lens magnification factor includes: 1) to take the correlation between a mark having a pattern provided on the imaging or focusing plane of a lens and the graphic of an aperture by detecting the backscattered electron, secondary electron and light generated when the image of the aperture for cell projection is scanned on the mark on a stage; 2) measuring the size of the graphic on the imaging plane of a lens, the magnification factor of which is to be defined; 3) to recognizing the position of the graphic on the imaging plane of the lens, etc. The adjusting of the magnification factor of a lens includes: 1) varying the current for the lens; 2) shifting the position of a stage; 3) shifting the position of the lens, etc.

By use of these means, not only the magnification factor of a lens but also the rotation and distortion of an image can be adjusted. Particularly, using an electron beam composed of plural graphics can provide an adjusting method suitable for automatic adjustment with higher accuracy than before.

Now it is assumed that the adjusting method has a feedback function as shown in the flowchart of FIG. 13. Although in this case, the adjustment is made using the permeated electron signal, it can be also done using the back-scattered electron, the secondary electron or light from the mark, and the current flowing through the mark. Now if the image of the apertures having the same shape is scanned on the mark composed of five stripe patterns 3 at regular intervals as shown in FIG. 14, the signal waveform as shown in FIG. 14 can be obtained. Then, the amplitude of the signal becomes the highest when the mark accurately overlaps with th image. If the image projected on the mark has been rotated, or if it has a different size from that of the mark, the amplitude becomes lower. For this reason, if the current of the lens making the image is adjusted so as to provide the maximum signal, the image having a desired size, and so a desired rotation and magnification factor, can be provided in an electron optical system. Further, if currents are caused to flow in opposite directions in lenses provided at two stages, only the magnification factor can be varied without producing the rotation of an image. The flowchart of FIG. 13 shows a particularly efficient manner of providing such adjustment.

Further, an explanation will be given of a means and a method of improving the throughput and high accuracy in the electron beam writing system.

The prior arts described above, which can reduce the writing time to 1/10 to 1/100, are efficient in repeatedly writing a single cell as in a semiconductor memory cell. On the other hand, in the case where plural irregular cell projection graphics are to be successively selected and projected, the time of selectively exchanging the graphic (response delay of a beam deflector) is problematic, and particularly if the shifting distance of a square beam generated by the first aperture is relatively long, its deflecting time is lengthened and also the way of controlling the beam deflection becomes complicated.

Accordingly, the fourth object of the present invention is to provide an electron beam writing system which can select the plural cell projection graphics at a high speed to enhance the throughput.

In order to attain the above fourth object, in accordance with the present invention, a square opening is provided at the center of a sub-mask portion, and a group of apertures for cell projection are arranged along two adjacent sides of the above square opening.

In projected a square pattern, the projecting position of a square electron beam for the square opening is adjusted to set its size, and in projecting the other pattern, the square electron beam is projected onto the above group of apertures for cell projection.

The length of each side of said square electron beam is made longer than that of the two sides of the above square opening, and longer than that of two sides of each of the above groups of apertures, but shorter than the length including the spacing between the group of the apertures for cell projection, thus preventing the image from being influenced from scattering of electron beams. The number of apertures in the group of apertures for cell projection is set for 5 within the above sub-mask from an actual viewpoint.

As an alternative pattern arrangement within the sub-mask according to the present invention, a square opening is arranged adjacent to the corner formed by two sides of the sub-mask, and also a group of apertures are arranged along the remaining two sides of the sub-mask. The above square opening is arranged adjacent to the corner formed by two sides of the sub-mask so that the average traveling distance of the square electron beam can be shortened.

A square pattern is formed by projecting the square electron beam on the square opening provided at the center of the above sub-mask whereas the other pattern is formed by projecting the electron beam on the above group of openings for cell projection around the above square opening.

The length of each side of the square electron beam is made longer than that of the two sides of each of the group of apertures for cell projection and made shorter than the length including the spacing between the group of apertures for cell projection, thus preventing the image from being influenced by scattering of electron beams.

Further, the number of apertures in the group of apertures for cell projection is set for 5 so that the traveling distance of the above square electron beam can be minimized on the average, and the number of masks at a memory cell level may be incorporated within the sub-mask.

BRIEF DESCRIPTION OF THE DRAWINGS

FIG. 1 is a schematic view of the arrangement of the electron beam writing system for cell projection for explaining the problem to be solved by the present invention;

FIG. 2 is a view showing the structure of an aperture for cell projection;

FIG. 21 is a graph showing a change in the signal amplitude due to a rotation lens current;

FIG. 22 is a schematic view of the mark for detecting back-scattered or secondary electrons;

FIG. 23 is a schematic view of the mark of a multi-layer film;

FIG. 24 is a schematic view showing the structure of the apertures in the second embodiment;

FIG. 30 is a schematic view of the aperture structure composed of two squares;

FIG. 31 is a schematic view of the projected image of the aperture structure of FIG. 30;

FIG. 32 is a schematic view showing the aperture structure for evaluating shot connection;

DESCRIPTION OF THE PREFERRED EMBODIMENTS

Figure 3:
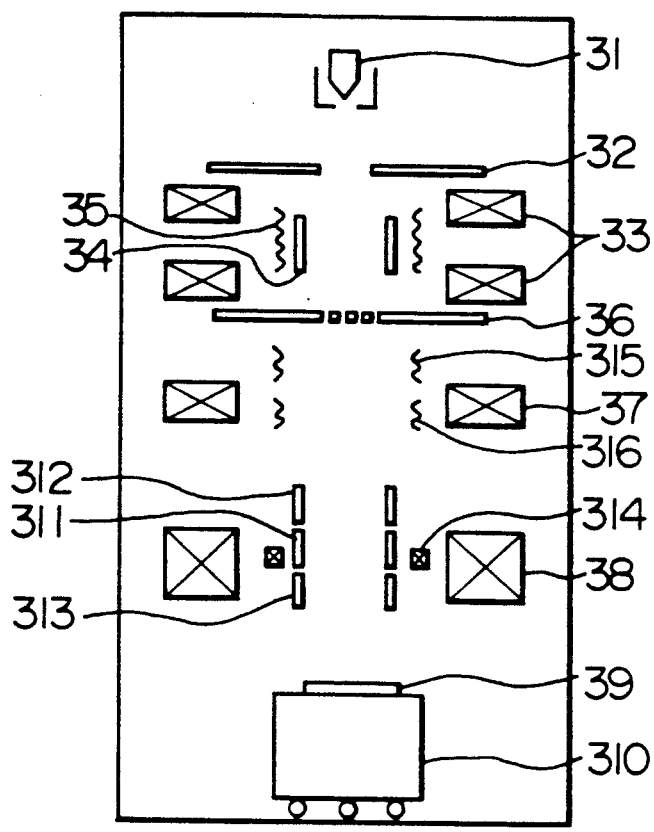
FIG. 3 is a view showing the electro-optic system according to the first embodiment of the present invention.

Now referring to the drawings, several embodiments of the present invention will be explained.

FIG. 3 shows an electro-optic system for cell projection according to the first embodiment of the present invention. In FIG. 3, in the case of variable shaping an electron beam passed through a first aperture 32 is deflected by a high speed projecting deflector 34, while in the case of cell projection (selection of a cell graphic), it is deflected by a low speed projecting deflector 35. The electron beam is passed through a second aperture 36 so that its shape is defined. The electron beam having the shape thus defined is projected onto a wafer 39 by a reduction lens 37 and an objective lens 38. The electron beam is deflected in order by a first deflector 311, a second deflector 312 and a third deflector 313 to be decided in its writing position on the wafer.

The third deflector 313 at the final stage requires high speed for deciding a shot cycle. In this electro-optic system, the high speed projection deflector 34 which defines the third deflection and the shaping size operates for a very short time of 100 ns. Therefore, the third deflector 313 only deflects a 50 μm square. The second deflector 312 deflects a 500 μm square, which is higher by one order of magnitude, for 10 μs. The first deflector 311 deflects a 5 mm square for 100 μs. On the other hand, the cell projection, which is carried out using a magnetic deflector, requires 8 μs for its deflection. Thus, if the cell graphic is selected simultaneously with the second deflection, the selection of the cell graphic is completed for the deflection time so that the writing can be made with high efficiency.

In this embodiment, several operations were performed simultaneously with the selection of the graphic. First, the origins of individual graphics were made coincident with each other by a re-deflector 315. This operation takes 8 μs. Also, the astigmatism newly generated owing to the deflection of the electron beam for selection of the graphic was corrected by an astigmatism corrector 316. This operation takes 6 μs. Further, the Coulomb effect was reduced by a focus corrector 314. This operation takes 10 μs. Finally, the amount of correction of deflection distortion was calculated again in order to deal with a change in the deflection distortion. The deflection correction was performed as follows in terms of the correction of the first deflection. Assuming that the correction amount is ΔX, and the deflection amounts are X and Y, the correction equation can be expressed as $$\Delta X = a_1 a_2 X + a_3 Y + a_4 XY + a_5 X^2 + a_6 Y^2 + a_7 X^3 + a_8 X^2 Y + a_9 XY^2 + a_{10} Y^3 \tag{1}$$

Assuming that at the same height, the coefficients for the aperture rate $\alpha$ are $a_1\alpha$, respectively, and those for the aperture rate $\beta$ are $a_1\beta - a_{10}\beta$, respectively, the coefficient for the aperture rate $\gamma$ can be calculated by interpolation expressed as $$a_{1\gamma} = \{a_1\alpha x(\beta - \gamma) + a_1\beta x(\gamma - \alpha)\}/(\beta - \alpha) \tag{2}$$

Figure 4:
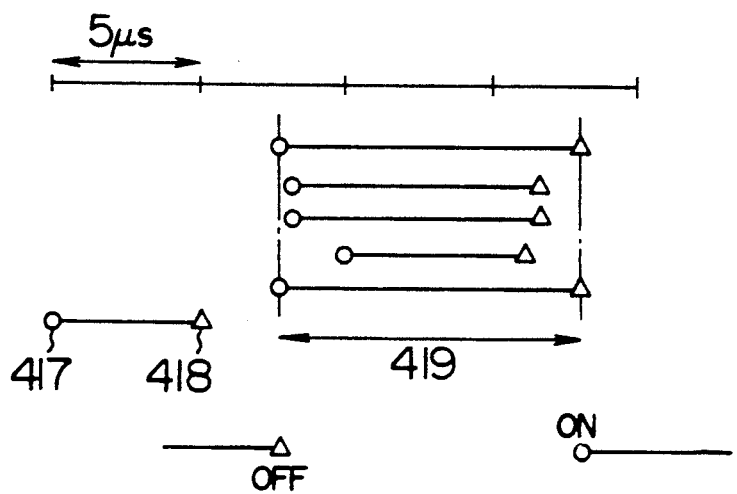
FIG. 4 is a view for explaining the timing relation in the operation relative to graphic selection.

The graphic will be written at the position corresponding to the correction amount ΔX thus newly calculated. This calculation takes 5 μs. In these operations, calculating the correction amount can be previously done on a computer. The remaining three operations can be performed individually from the deflection of the graphic selection so that all the operations can be completed within the time for focus correction which takes the longest time. In addition, if these operations are performed concurrently with the second deflection, the operations from the selection of the graphic to the deflection correction can be done for the deflection time. Thus the time required for these operations can be substantially ignored. The time relationship among all the operations are shown in FIG. 4. As understood from FIG. 4, if the correction amount is previously calculated, the focus correction taking the longest time is started with the second deflection, all the operations can be completed within the deflection time. Thus, the times required for the operations attendant to the graphic selection can be substantially ignored. Accordingly, in accordance with the present invention, only the advantage of reducing the number of shots due to using the graphic for cell projection can be obtained.

Figure 5:
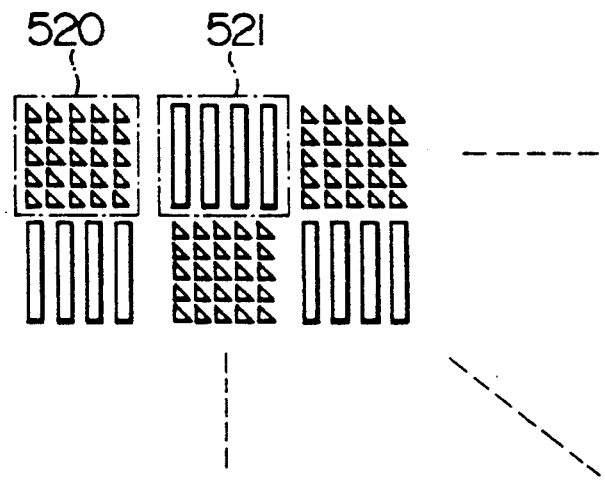
FIG. 5 is a view showing the writing pattern in the first embodiment of the present invention.
Figure 6:
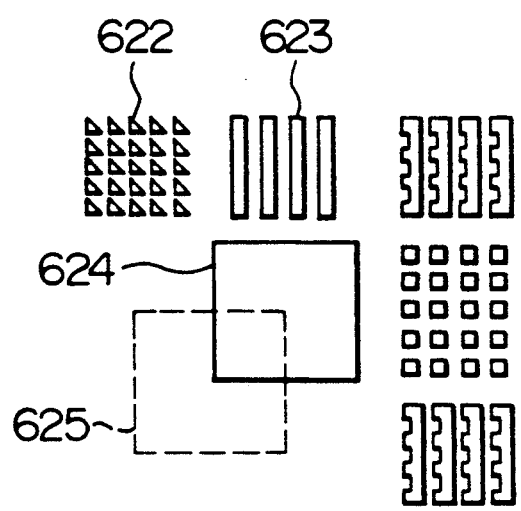
FIG. 6 is a view showing an aperture arrangement in the first embodiment.

The pattern written by the writing system according to this embodiment is shown in FIG. 5 and the aperture used therefore is shown in FIG. 6. As seen, the pattern of FIG. 5 is composed of two kinds of graphics A520 and B521 which are repeated. Therefore, the apertures having graphics 622 and 623, respectively are required. The method of writing these patterns includes two ways of successively writing neighboring graphics in a fashion of A, B, A, B, ... and of first writing all the A's and thereafter writing all the B's. In this embodiment, the graphic is selected concurrently with the second deflection by the second deflector 312 in FIG. 3 so that the region which can be written by the third deflector 313 is written first in one graphic and thereafter the remaining region is written in another graphic. Thus, the time required for graphic selection can be minimized.

Figure 7:
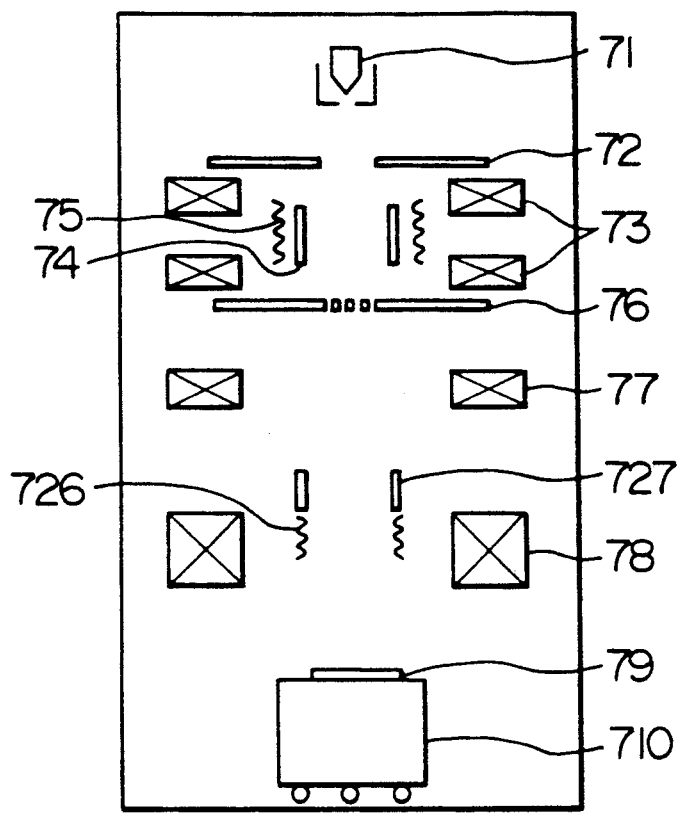
FIG. 7 is a schematic diagram of the electro-optic system according to the second embodiment of the present invention.
Figure 8:
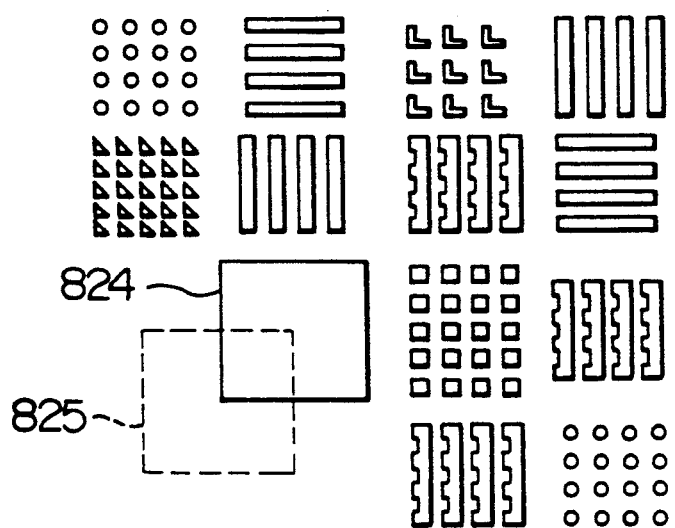
FIG. 8 is a view showing an aperture arrangement in the second embodiment.

Now referring to FIGS. 7 and 8, an explanation will be given of an electro-optic system according to the second embodiment of the present invention. In this embodiment, the writing position was defined by two deflectors of a main deflector 726 and a subdeflector 727. The time required for the main deflection is 30 μs, and the time required for the sub-deflection is 0.2 μs. FIG. 8 shows the apertures for cell projection used in this embodiment. The number of graphics to be used is larger than in the first embodiment. For this reason, the time required for deflection by a magnetic deflector for selecting a graphic is 15 μs. Therefore, the graphic is selected concurrently with the main deflection. In this embodiment, the operation attendant to the graphic selection requires only changing the correction amount of deflection distortion. Thus, the degree of blurring of the electron beam becomes large. The correction amount of deflection distortion is calculated again for each selection of the graphic with the coefficients $a_1\alpha$−$a_{10}\alpha$ in Equation (1) previously measured for different positions of graphics. The time required for this operation is 8μ. Therefore, if the correction amount is calculated before starting the main deflection, and the deflection for graphic selection is accomplished within 15 μs thereafter, the time required for graphic selection apparently disappears.

Figure 9:
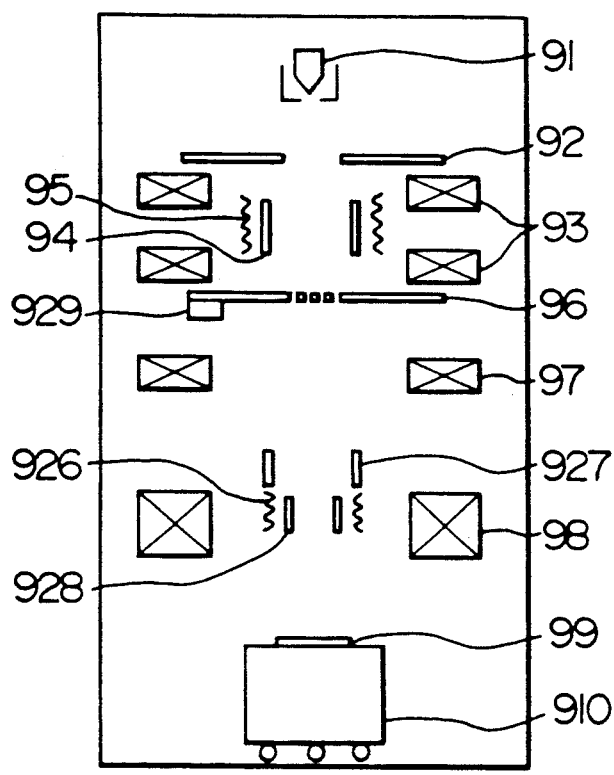
FIG. 9 is a schematic diagram of the electro-optic system according to the third embodiment of the present invention.
Figure 10:
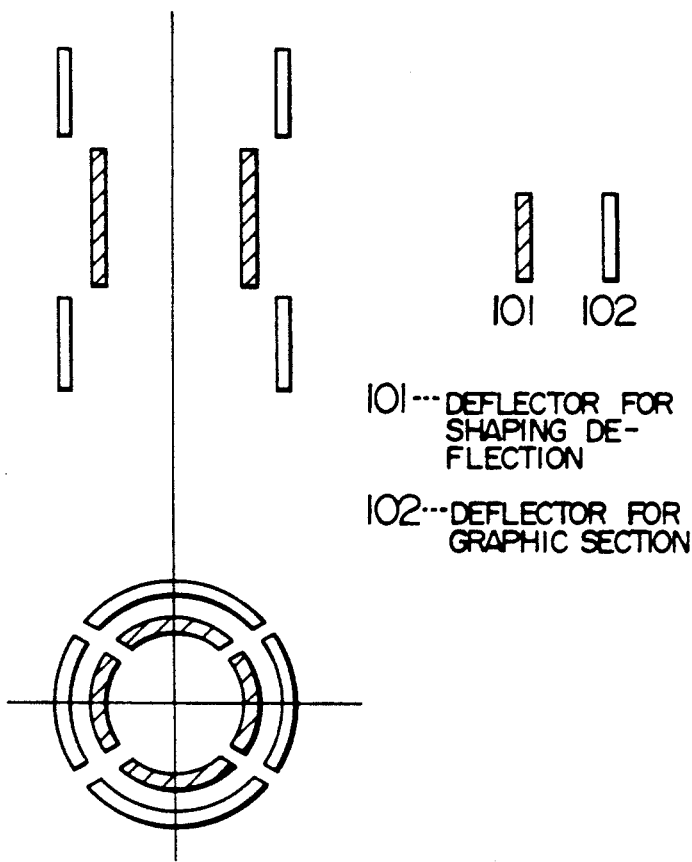
FIG. 10 is a schematic view showing the structure of a electrostatic deflector.

Now referring to FIG. 9, an explanation will be given of an electro-optic system according to the third embodiment of the present invention. In this embodiment, the size of the graphic for the aperture is made small so that the deflection for graphic selection is completed for 3 μs. In this case, the deflector for defining the writing position is composed of a main deflector operating for 5 μs and a sub-deflector operating for 0.1 μs. The graphic is selected concurrently with the main deflection. Further, this embodiment is characterized by provision of a device 929 for measuring the current flowing through the second aperture and an electrostatic focus corrector 928. First, using the current measuring function, an electron beam is projected on each of the graphics on the second aperture to measure the current flowing through the aperture. The smaller the aperture rate of the aperture graphic, the larger the current amount flowing so that the aperture rate can be calculated on the basis of the current amount; the focus correction may be made using the aperture rate. The reason why the focus correction is made electrostatically is to shorten the focus correction time so that it is made within the deflection time. The focus correction made magnetically takes a relatively long time due to an eddy current. So, in order to make sufficient focus correction for a short time such as correction of the Coulomb effect, the electrostatic focus correction is particularly desired. The electro-optic system according to this embodiment is applied to the production of semiconductor memories. In this case, when the DRAM of 16 Mbit is written on a 6 inch wafer, the throughput of 20 pieces/hour can be obtained. Also, quantum effect devices having a size of 0.05 μm can be fabricated with the throughput of $10^9$/hour. Further, photo-masks or X-ray masks can be made at a high speed.

In accordance with the present invention, the cell projection method can be efficiently adopted in the conventional variable shaping electron beam writing system so that a much higher throughput than before can be realized. Thus, the production efficiency of miniaturized devices and reticles can be greatly improved.

Figure 11:
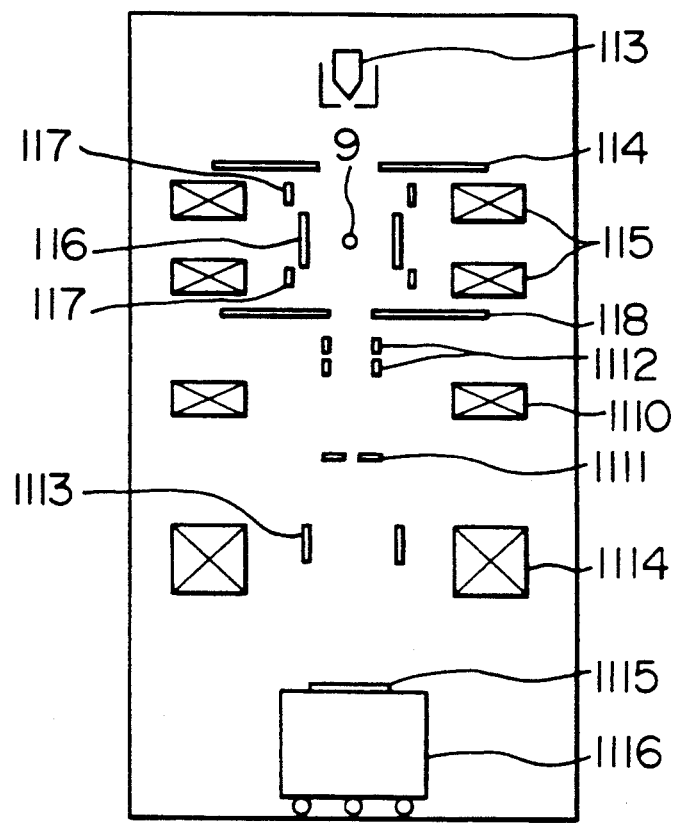
FIG. 11 is a schematic diagram of the entire arrangement of the electron beam writing system.
Figure 12:
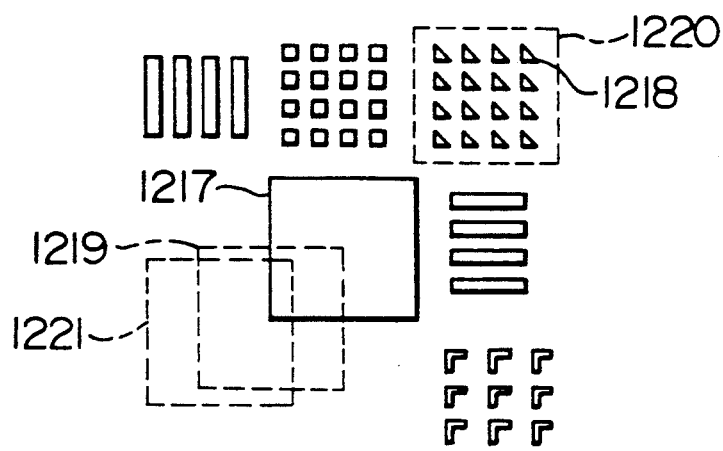
FIG. 12 is a schematic view showing an aperture arrangement.
Figure 13:
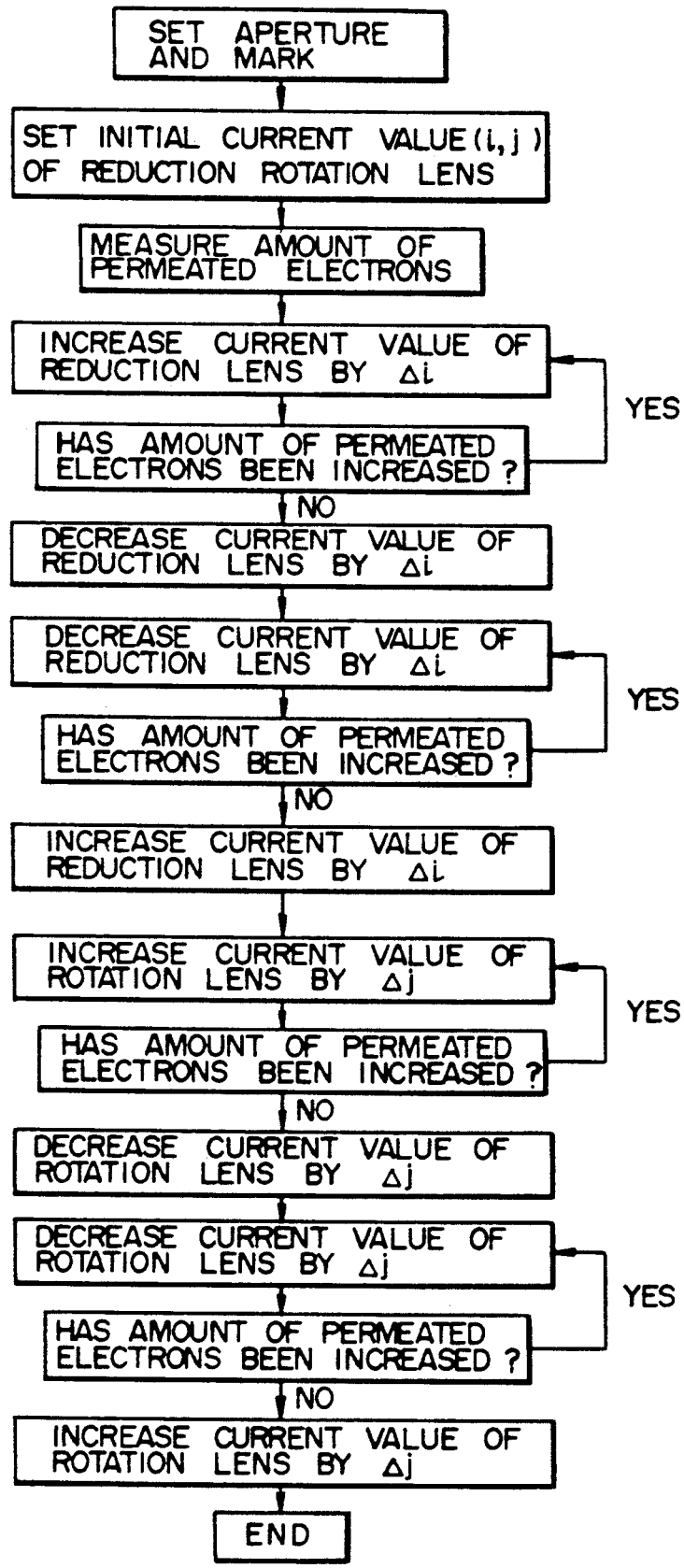
FIG. 13 is a flowchart for explaining the method for adjusting the electro-optic system according to the present invention.
Figure 14:
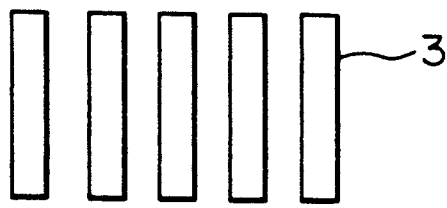
FIG. 14 is a view showing an example of the mark pattern according to the present invention.
Figure 15:
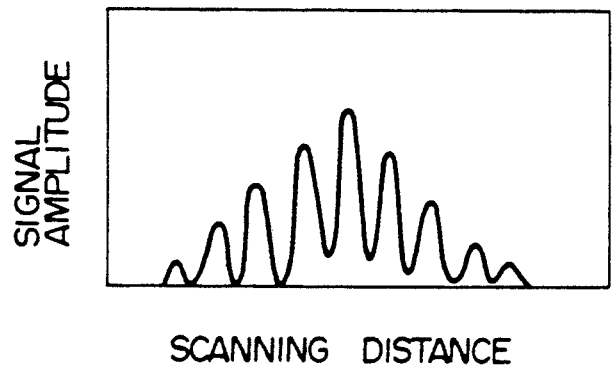
FIG. 15 is a view showing an example of the signal waveform due to the mark pattern of FIG. 14.

Now referring to FIGS. 11 and 12, an explanation will be given of an electron beam writing system according to the fourth embodiment of the present invention. FIG. 12 shows the structure of apertures. As seen from FIG. 12, in the case of graphic selection, the image of the first aperture is used for only illumination of the second aperture. Therefore, the image distortion of the first aperture is not problematic as long as the second aperture does not go beyond the image of the first aperture. On the other hand, in the case of shaping deflection, the image distortion of the first aperture directly influences the graphic to be written. Therefore, in the case of shaping deflection, the first aperture image must be deflected with high accuracy. As described previously, the deflector which is divided into two parts is likely to provide a large deflection aberration so that in this embodiment, the deflection for shaping deflection is executed by a central deflector. Namely, the shaping deflection is performed by a deflector 116 and the deflection for graphic selection is performed by another deflector 117. The shaping deflection works at the voltage of 20 V and the deflection time results in a high speed of 50 ns. On the other hand, the deflection of graphic selection requires the voltage of 50 V because of a large deflection angle and so the deflection time is 1 μs. Additionally, the deflection center of both deflections is caused to be coincident with the crossover image 1119 of projection lenses at an upper stage so that the crossover position due to the deflection is not shifted. In the writing system according to this embodiment, an objective diaphragm 1111 is arranged on the crossover imaging face of a reduction lens 1110 so that coincidence of the crossover and the deflection center is required to maintain constant the current density on a wafer 1115. From this viewpoint, necessity of coincidence of the deflection centers of both deflectors should be understood. In performing the graphic selection, the axis of the electron beam is restored to an initial position on the crossover imaging face of the projection lens at a lower stage by a re-deflector 1112. As a result, the change in the locus due to the graphic selection is limited to the space between the deflector 117 for graphic selection and the re-deflector 1112 so that the reduction of writing accuracy such as the distortion or astigmatism due to the change in the locus can be minimized. Thereafter, the electron beam is imaged on the wafer 15 through the reduction lens 1110 and an objective lens 1113.

It should be noted that the deflector plate used in this embodiment necessarily becomes more bulky than in only the case of shaping deflection. Then, the outer deflector (graphic selection deflector in this embodiment) enters the magnetic field of the projection lens. The deflection within the magnetic field rotates the locus of an electron beam so that the center of the deflector is not necessarily a deflection center. Such influence makes it difficult to cause the deflection centers of both deflectors to be coincident. In order to obviate this influence, it must be canceled by two projection lenses. To this end, the excitation directions of the upper and lower lenses are made opposite to place the deflector electric field and the lens magnetic field in a symmetrical relationship in the vertical direction. The same influence also appears on the re-deflector. In this embodiment, the re-deflector is also divided into two parts and the directions of deflection in the two parts are changed so that the crossover image is coincident with the deflection center. Further, in order to correct the astigmatism generated due to graphic selection, the re-deflector 1112 is constituted as an eight-pole electrostatic deflector which can correct the astigmatism.

In the case where the conventional magnetic deflector is arranged with the deflection center coincident with that of the shaping deflector, the time required for the deflection is 10 μs which is about ten times as long as that in the electrostatic deflection. As a result of writing the SRAM having a size of 0.5 μm, the electrostatic deflection provides a throughput of 10 pieces/hour whereas the magnetic deflection provides a throughput of only 7 pieces/hour.

In accordance with this embodiment, the graphic selection can be performed at a high speed in the electron beam writing system in a cell projection method. This permits the writing step of a semiconductor circuit or a photo-reticle to be executed at a high speed, thus increasing the productivity.

Now referring to FIGS. 16 to 23, an explanation will be given of the means of realizing the high reliability in the variable shaping electron beam system in a cell projection method according to the fifth embodiment of the present invention.

Figure 16:
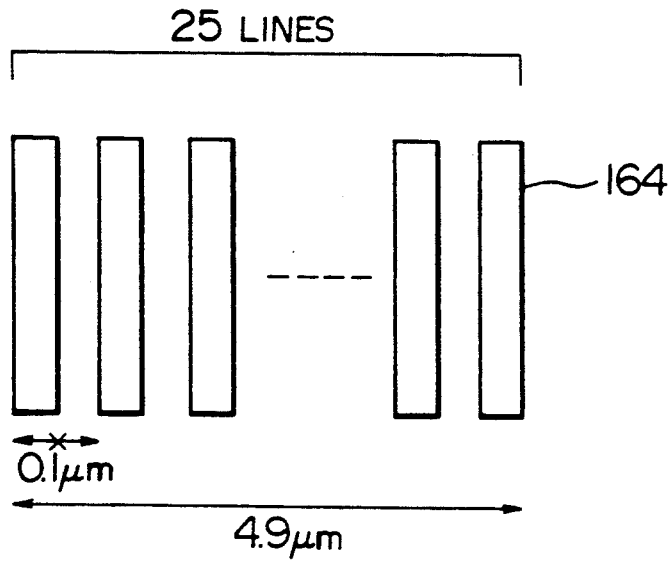
FIG. 16 is a schematic view showing the structure of the mark pattern used in the first embodiment.

FIG. 16 shows an example of a mark shape in which 25 apertures 164 each having a width of 0.1 μm are arranged at intervals of 0.1 μm on a single crystal (110) Si substrate. The pattern was made in combination of interference exposure of light and anisotropic etching using KOH. The method for making the pattern will be explained below. First, an oxide layer 20 nm thick is formed on a single crystal (110) Si substrate by thermal oxidation. A photo-resist 0.1 μm is applied on the oxide layer by a spinner. A 0.1 μm line-and-space grating image is formed on the photo-resist by a laser interference exposure device using a He—Cd laser (325 nm). After the resist has been developed, the grating pattern is projected on the oxide layer. The projection is done using a solution of HF:NH$_4$OH=1:6. Using the oxide layer as a mask, 3 μm Si-anisotropic wet etching is performed using a KOH 30 wt % solution (80° C.) to provide a desired mark pattern. Thus, the interval of 4.9 μm including 25 lines between both ends of the pattern can be reproduced with the accuracy of 1 nm or less. Further, the Si substrate is etched by anisotropic wet etching using a KOH solution from its back surface to the thickness of 3 μm so that the above pattern serves as an aperture pattern. The Si substrate is evaporated with Au from its front and back surfaces to make an adjusting mask on a wafer. The pattern having the same structure and magnified 25 times in its transversal size is used as an adjusting aperture. The aperture is made on a single crystal (100) Si substrate. First, a photo-resist is applied on the Si substrate by the spinner. An aperture pattern is written on the photo-resist by the electron beam writing device. Using the resist pattern as a mask, the Si substrate is etched to the depth of 20 μm. Further, the Si substrate is etched by anisotropic wet etching using a KOH solution from its back surface to the thickness of 20 μm so that the above pattern serves as an aperture pattern.

Figure 17:
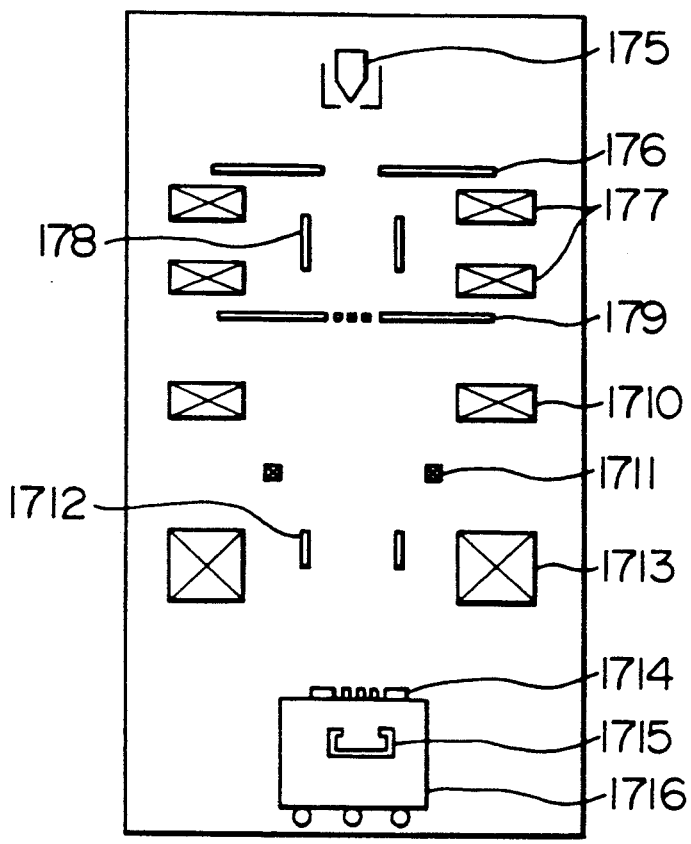
FIG. 17 is a view for explaining the arrangement of the mark pattern and aperture.
Figure 18:
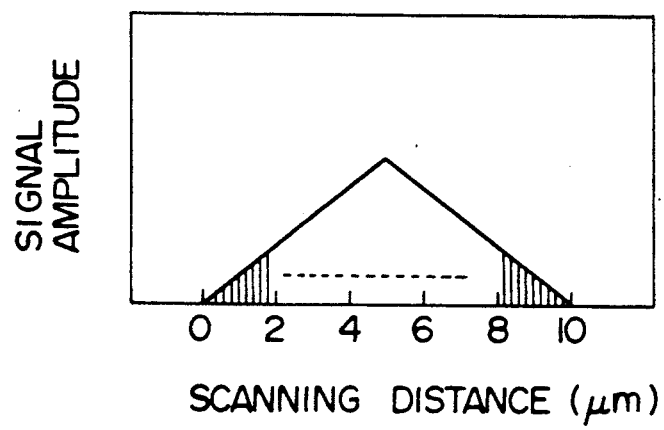
FIG. 18 is a waveform chart of the signal obtained in the first embodiment.
Figure 19:
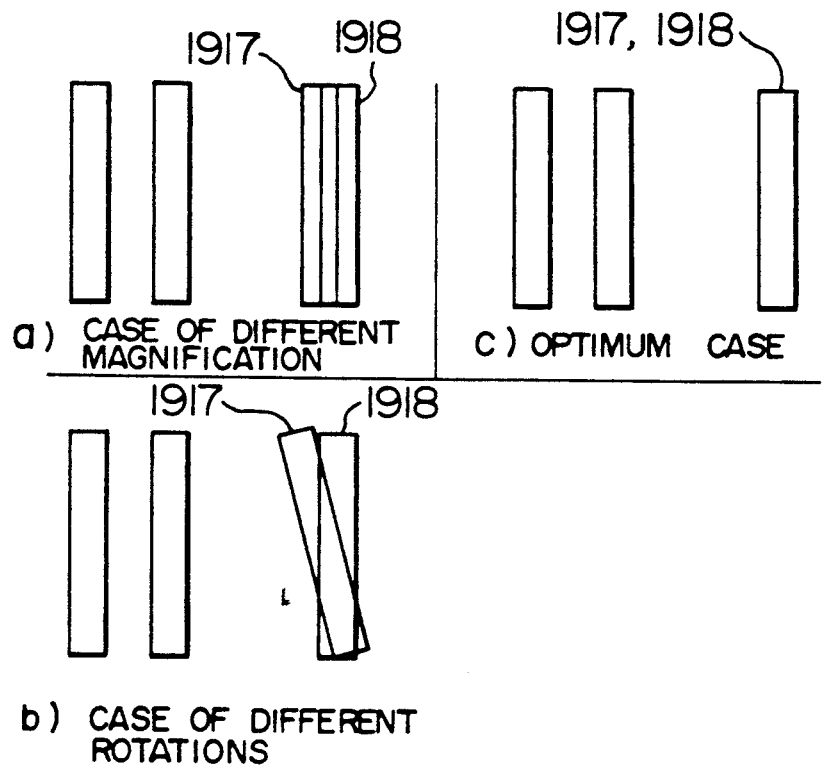
FIG. 19 is a view for explaining fluctuation of the projected image due to poor adjustment.
Figure 20:
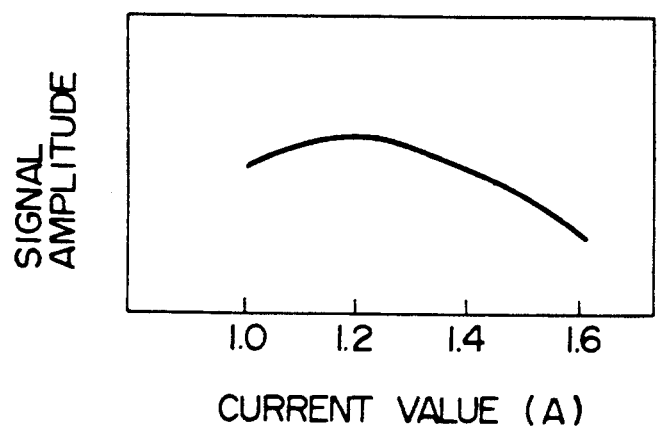
FIG. 20 is a graph showing a change in the signal amplitude due to a reduction lens current.

Both patterns are attached to the electron beam writing system as shown in FIG. 17. The electron beam emitted from an electron gun 175 is shaped by limiting diaphragm 176 and projected on the above aperture through projection lenses 177 and projection deflector plates 178 so that the image of the aperture pattern is formed on the mark 1714 on a stage 1716 through a reduction lens 1710, a rotation lens 1711 and an objective lens 1713. The electron beam having permeated through the aperture pattern 179 and the mark 1714 is detected by a Faraday cup 1715. Therefore, if the image of the aperture pattern is scanned on the mark 1714 by a deflector plate 1712, the current waveform as shown in FIG. 18 will be obtained. The peak value shown by an arrow is the highest when the reduced aperture image 1918 projected on the mark 1714 coincides with a mark pattern 1917 as shown in FIG. 19C, and it is lower when they have different magnifications as shown in FIG. 19A and form a rotation angle as shown in FIG. 19B. For this reason, monitoring this peak value permits the magnification and rotation of the image to be adjusted. FIG. 20 shows the relationship between the current value in the reduction lens 1710 and the resultant waveform height (signal amplitude). As seen from this figure, the optimum current value in the reduction lens 1710 is 1.2 A. FIG. 22 shows the relationship between the current value in the rotation lens 1711 and the resultant waveform height. As seen from this figure, the optimum current in the rotation lens 1711 is 0.14 A. In the writing system according to this embodiment, it has been found that the electro-optic system can be adjusted with an accuracy of magnification of 0.3% and with a rotation angle of 5 mrad on the basis of the image written on a resist. In this case, the position fluctuation on the image at the corners of a 5 μm square is 0.04 μm. Incidentally, it should be noted that the electro-optic system can be adjusted by adjusting not only the lens current but also the respective heights of the lenses and the apertures.

The adjusting method as described above can also be applied to the mark other than the above permeating type of mark. For example, only wet anisotropic etching of Si by 0.2 μm with no etching from the back face thereof in the process of fabricating the mark provides the mark of Si having the sectional structure as shown in FIG. 22. The same adjustment as described above can be done by detecting as a signal the back-scattered electron or secondary electron from this mark.

A mark with high dimensional accuracy can also be formed by stacking layers of different materials. For example, as shown in FIG. 23, respective thin films 2321 and 2322 of GaAlAs and GaAs are alternately grown on a GaAs substrate 2320 by MOCVD techniques to form a multi-layer film crystal. Only the GaAlAs films 2321 of this crystal are selectively etched using a solution of HF:NH$_4$F=1:6. Inclining this substrate by 90 degrees provides the mark having the sectional structure as shown in FIG. 23. The MOCVD techniques have a very high capability of controlling the film thickness and can provide the mark with high dimensional accuracy.

Figure 25:
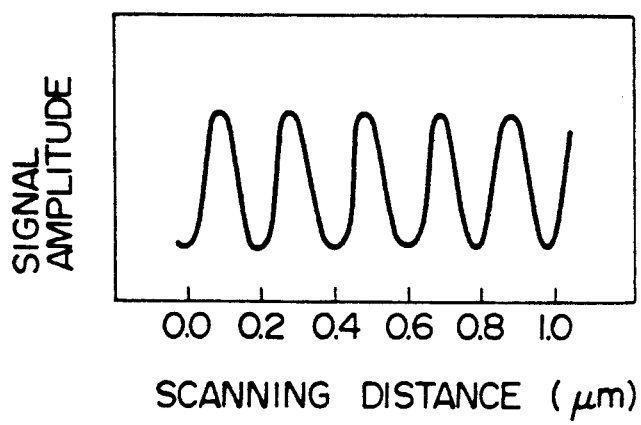
FIG. 25 is a waveform chart of the signal obtained in the second embodiment.
Figure 26:
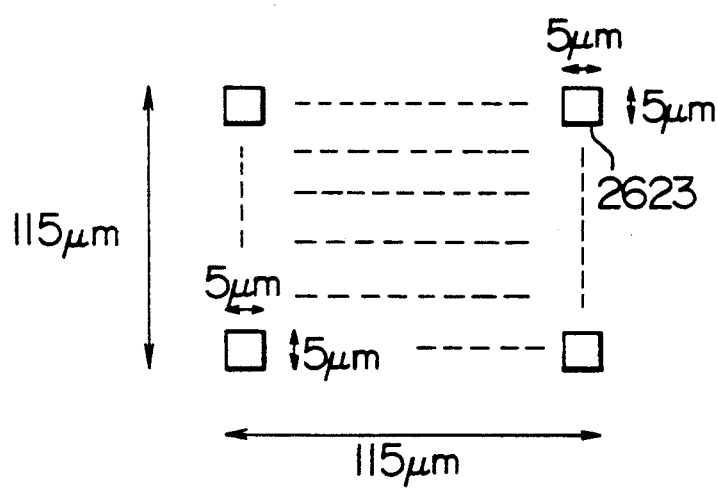
FIG. 26 is a schematic view showing the structure of the apertures in the fourth embodiment.

An explanation will be given of the electron beam writing system according to a sixth embodiment of the present invention. This embodiment uses the mark having the sectional structure as shown in FIG. 22 and the aperture pattern with 125 lines as shown in FIG. 24. The aperture pattern is formed by the light interference exposure method which was used to form the mark pattern in the fifth embodiment of the present invention. The aperture pattern, which was reduced to 1/25, has improved accuracy of the apertures so that the accuracy of 5 nm was obtained at both ends of the image on a wafer. Also, in this embodiment, the back scattered electrons are detected as a signal. The signal waveform thus obtained at the central portion of a scanned region is shown in FIG. 25. The aperture pattern has a large number of lines (125) so that the same signal waveform continues in a fixed region at the central portion. In this case, the amplitude of this waveform depends on the rotation angle and magnification and also the period thereof is proportional to the magnification. The amplitude and period were calculated by frequency analysis to adjust the rotation angle and magnification. This embodiment is characterized in that the magnification can be directly known from the period. This embodiment can provide an accuracy of 0.2% in the magnification and 2 m radian in the rotation angle. In the case where the signal other than permeated electrons is used as in this embodiment, a mark pattern is formed on a Si wafer so that the adjustment can be made in the same condition as in the ordinary writing.

An explanation will be given of the electron beam writing system according to a seventh embodiment of the present invention. In this embodiment, the adjustment mark includes 125 lines and the aperture pattern includes 50 lines each having a width of 2.5 μm. The resultant signal waveform of the back-scattered electrons is the same as shown in FIG. 25. However, in this embodiment, in which the period of the waveform is fixed, the rotation angle and magnification can be adjusted by only maximizing the amplitude thereof. This embodiment can provide an accuracy of 0.4% in the magnification and 5 mrad in the rotation angle.

An explanation will be given of the electron beam writing system according to the present invention. In this embodiment, the adjustment mark includes 12 lines each having a width and a space of 0.2 μm. On the other hand, the aperture pattern includes 144 apertures each of a 5 μm square. In this embodiment, two marks and one aperture provide two signals for adjustment each having the same signal waveform as shown in FIG. 18. By maximizing the amplitude of each signal, the magnification and the rotation angle can be adjusted with higher accuracy. If the mask is also designed as a two-dimensional pattern, one aperture and one mark can provide a scanning signal in both the vertical and horizontal directions.

Figure 27:
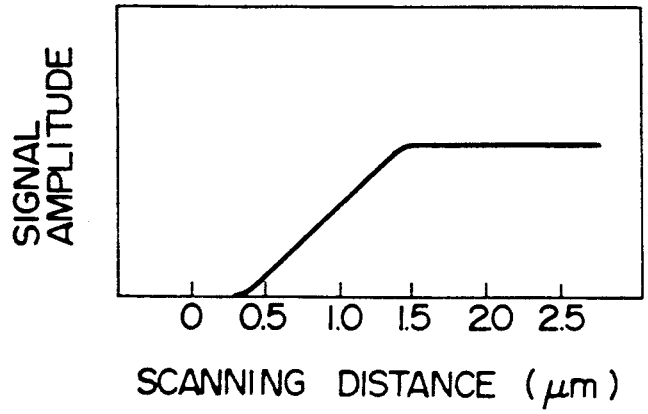
FIG. 27 is a graph showing the amplitude of an electron having permeated through a knife edge.

An explanation will be given of the electron beam writing system according to a ninth embodiment of the present invention. In this embodiment, the aperture is designed as a 25 μm square. The projected image of this aperture is scanned on a knife edge of Si located on a stage; the permeated signal thus obtained has the waveform as shown in FIG. 27. The size of the projected image depends on the extreme point of the second derivative of the signal. If either of the lens current, lens position, the aperture position and the wafer position is adjusted so that the size of the image is 1 μm, the magnification is accurately 1/25.

Figure 28:
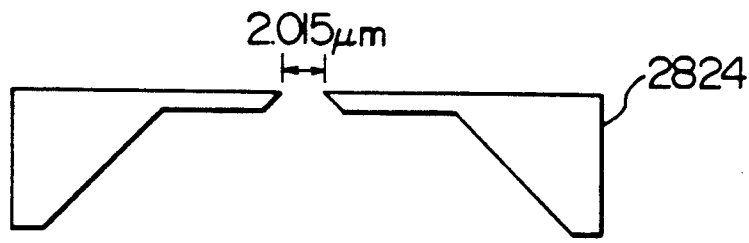
FIG. 28 is a schematic view showing the structure of two knife edges.
Figure 29A:
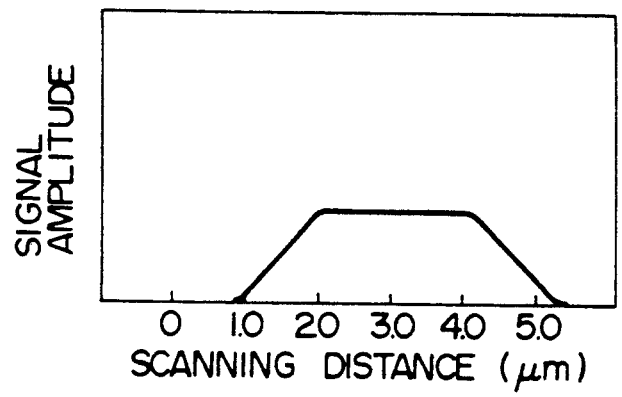
FIGS. 29A to 29C are graphs showing the signal amplitudes of the electrons having permeated through the knife edge.
Figure 29B:
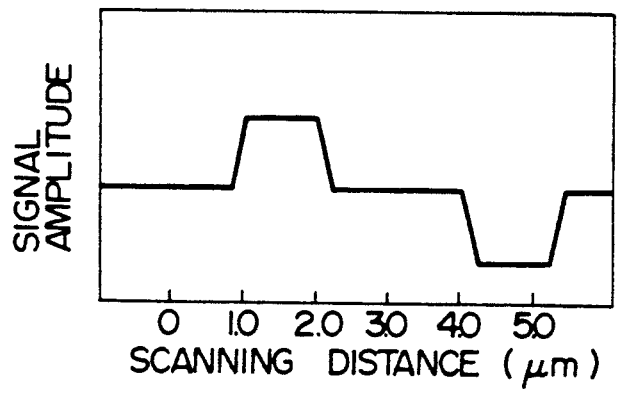
Figure 29C:
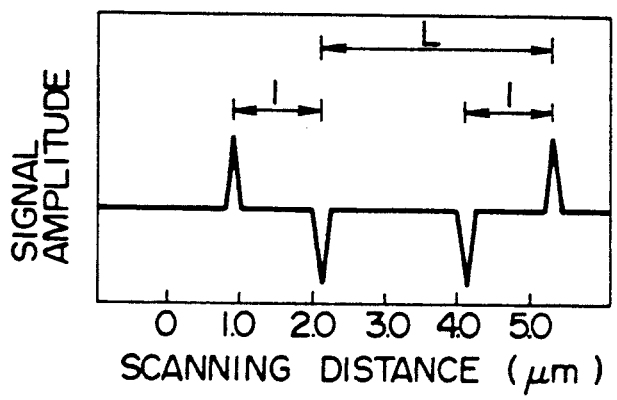
Figure 33:
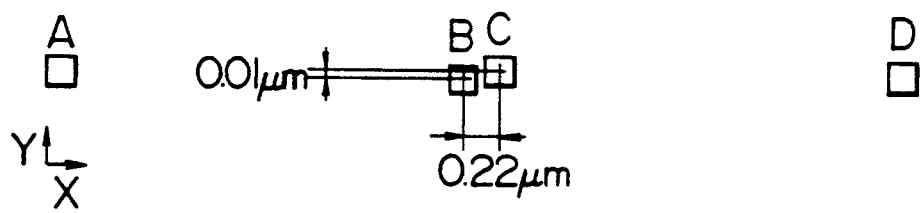
FIG. 33 is a schematic view of the projected image of the aperture structure of FIG. 32.

An explanation will be given of the electron beam writing system according to a tenth embodiment of the present invention. The same measurement as in the ninth embodiment was made using two knife edges designed as shown in FIG. 28. The interval between the knife edges which is previously measured by an electron beam metrology system is 2.015 μm. The signal waveform obtained by scanning is shown in FIG. 29A. FIGS. 29B and 29C are the results of the first and the second derivative of the signal, respectively. As understood from FIG. 29C, the size l of an electron beam can be calibrated by the size L of the knife edge. By setting the beam size l for 1 μm, the reduction rate of 1/25 can be obtained. In this embodiment, the mark itself for scanning the image has the function of the criterion for defining the size so that the accuracy of measuring the beam size can be enhanced.

An explanation will be given of the electron beam writing system according to an eleventh embodiment of the present invention. In this embodiment, the aperture pattern consisting of two squares as shown in FIG. 30 was used. This aperture pattern is scanned on the Si knife edge on a stage and the relative positions of the centers of the images of the above two squares were measured in terms of the amounts of permeated electrons. It was found that the two squares on an XY coordinate are apart by 4.05 μm in the X direction and by 4.15 μm in the Y direction. On the basis of this result, the reduction rate of 1/24.388 and the rotation angle for the stage of 12.2 mrad can be obtained. Assuming that coordinates of two points on the aperture pattern are a and b, and those of the image are A and B, the magnification and rotation angle can be calculated by $$M^2 = (A^2+B^2)/(a^2+b^2) \quad \tan\theta = (aB-bA)/(aA+bB)$$

Conventionally, the electro-optic system was adjusted using an electron beam having a single graphic, and in most cases, the signal corresponding to the beam edge was used. On the other hand, if the electron beams constituting plural graphics are used as in this embodiment, the electro-optic system can be adjusted using the central positions of the beams. Since the beam center position can be recognized with higher accuracy than the beam edge, this embodiment using plural beams can provide an excellent method for adjusting the electro-optic system.

An explanation will be given of the electron beam writing system according to a twelfth embodiment of the present invention. The accuracy of connecting shots was measured using the aperture pattern as shown in FIG. 32. First, the coordinates of two points at a deflection position to be measured are measured. Further, the two points deflected in the X direction by 5 μm are measured. If the distance between squares B and C is 0.2 μm in the X direction and 0 μm in the Y direction, the shot connecting error is zero. The distance between the squares B and C was 0.22 μm in the X direction and 0.01 μm in the Y direction. Therefore, it was found that in this embodiment, the connecting errors are 0.02 μm (X direction) and 0.01 μm (Y direction). Incidentally, the method according to this embodiment can be carried out by using both the aperture patterns having only the square B's and only square C's.

Figure 34:
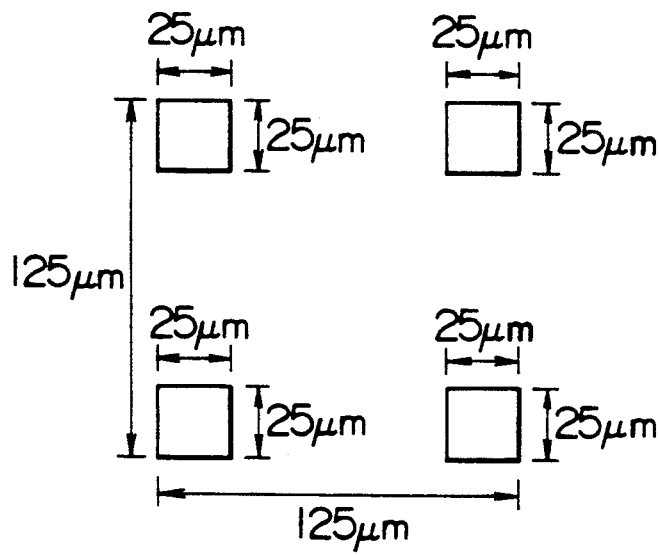
FIG. 34 is a schematic view of the aperture structure composed of four squares.
Figure 35:
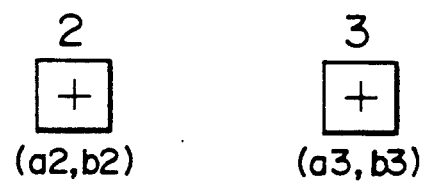
FIG. 35 is a schematic view of the projected image of the aperture structure of FIG. 34.
Figure 35:

An explanation will be given of the electron beam writing system according to a thirteenth embodiment according to the present invention. A graphic distortion was measured using the aperture pattern as shown in FIG. 34. It is assumed that the relative positions of image patterns 1, 2 and 3 to an image pattern 0 are expressed as (a1, b1), (a2, b2) and (a3, b3). The distortion can be taken as a change in the shape of the graphic other than the rotation and enlargement/reduction so that the amount of distortion can be evaluated by the parameter P:

$$P^2 = (a2+b1)^2 + (b2-a1)^2 + (a2-a1+b1)^2 + (b2-a1-b1)^2 \tag{3}$$

Figure 36:
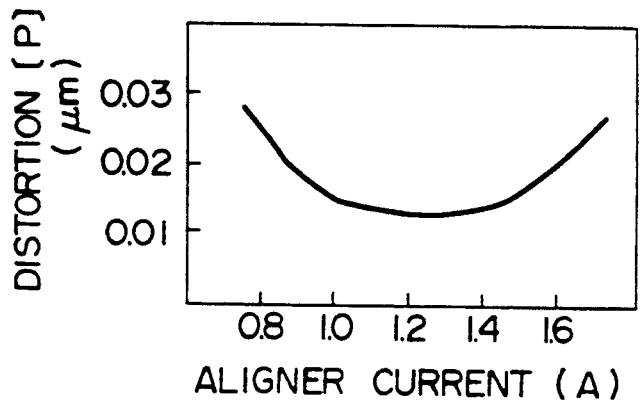
FIG. 36 is a graph showing the result of minimization of a distortion.

FIG. 36 shows a change of the distortion when the current in the electromagnetic aligner is varied. Changing the aligner current permits the axis adjustment with high accuracy to minimize the distortion.

The adjusting method according to the present invention can be applied on not only the image plane of an objective lens but also those of all lenses. For example, in FIG. 17, the projection lens 177 can be adjusted in such a manner that an adjustment aperture is used for the limiting diaphragm 176 and the correlation of the graphic at issue with the aperture is investigated in the current which is detected by the Faraday cup 1715.

An explanation will be given of the electron beam writing system according to a fourteenth embodiment of the present invention. The cell projection method, which permits a complicate graphic to be projected at a time, is suitable to particularly, high speed fabrication of a device having a memory with repeated patterns. As described previously, the present invention is a technique indispensable to the cell projection method and so the electron beam writing system provides a high-speed high accuracy semiconductor device fabricating method unlike the ordinary electron beam writing system.

Figure 37:
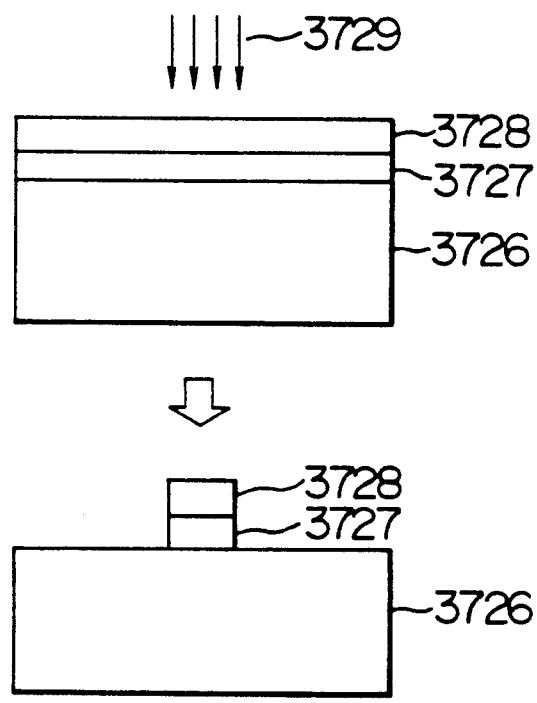
FIG. 37 are sectional views showing the process of fabricating a semiconductor device.
Figure 38:
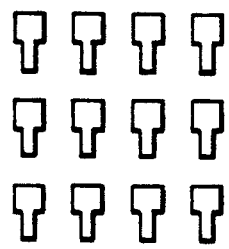
FIG. 38 is a schematic view showing the aperture structure for making electrodes.

Now referring to FIGS. 37 and 38, an explanation will be given of the process of fabricating the gate electrode of a metal oxide semiconductor (MOS) device by the electron beam writing system according to the present invention. FIG. 37 shows the process of making the gate electrode. First, a metal W 3727 which constitutes the gate electrode is deposited on a semiconductor substrate 3726 and further, an electron beam resist 3728 is applied thereon. Using the electron beam writing system according to the present invention, a 0.2 μm size pattern is written on the resist. The aperture pattern used is shown in FIG. 38. The resist irradiated with the electron beam is developed and the metal W is etched to form the electrode pattern of W. The size of 0.2 μm is the valve that is difficult to realize by photolithograph. All the remaining steps were executed by photolithograph. As a result, the threshold voltage having a small range of 5 V±0.01 V was obtained. The writing adopting the cell projection method could be done at a speed several times higher than the variable shaping method. On the other hand, with no adjustment according to the present invention, the error in the size of the image of a cell graphic provides a position fluctuation of the gate electrode, which results in a large range of the threshold voltage of 5.1 V±0.1 V.

As described above, the semiconductor device fabricating method according to the present invention can provide the high yield high accuracy writing at high speed. The present invention can also be applied to fabrication of reticles for a photo-stepper and X-ray mask as well as the semiconductor devices.

Accordingly, in accordance with the present invention, the adjustment of the electro-optic system and the electron beam writing can be realized with high accuracy. Particularly, the present invention is indispensable to improve the accuracy of the cell projection method. The present invention greatly contributes to improve productivity in the electron beam writing process in the miniaturized processing for a semiconductor device or the like.

Meanwhile, the square aperture may be provided adjacently to the corner formed by two sides of the submask to further shorten the average traveling distance of the square electron beam.

An explanation will be given of the electron beam writing system according to a fifteenth embodiment of the present invention.

Figure 39:
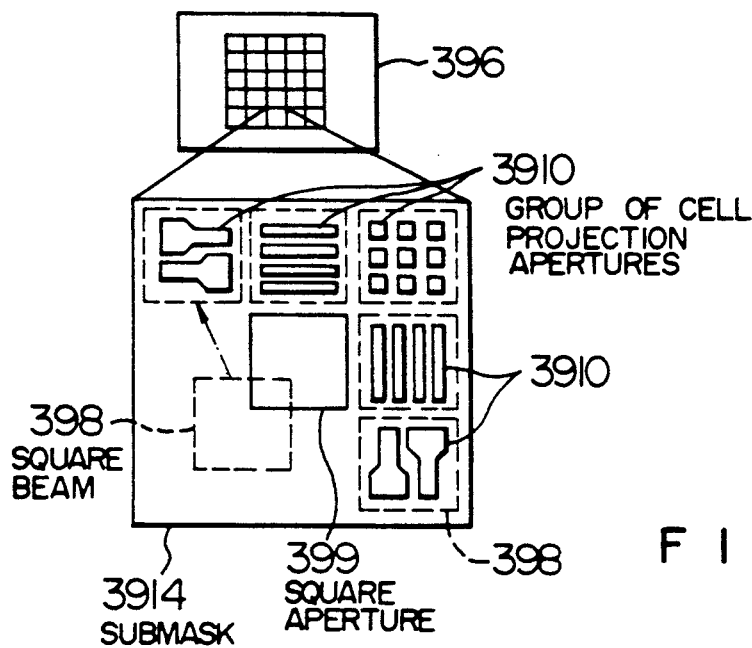
FIG. 39 is a plan view of an example of the mask pattern for cell projection.
Figure 40:
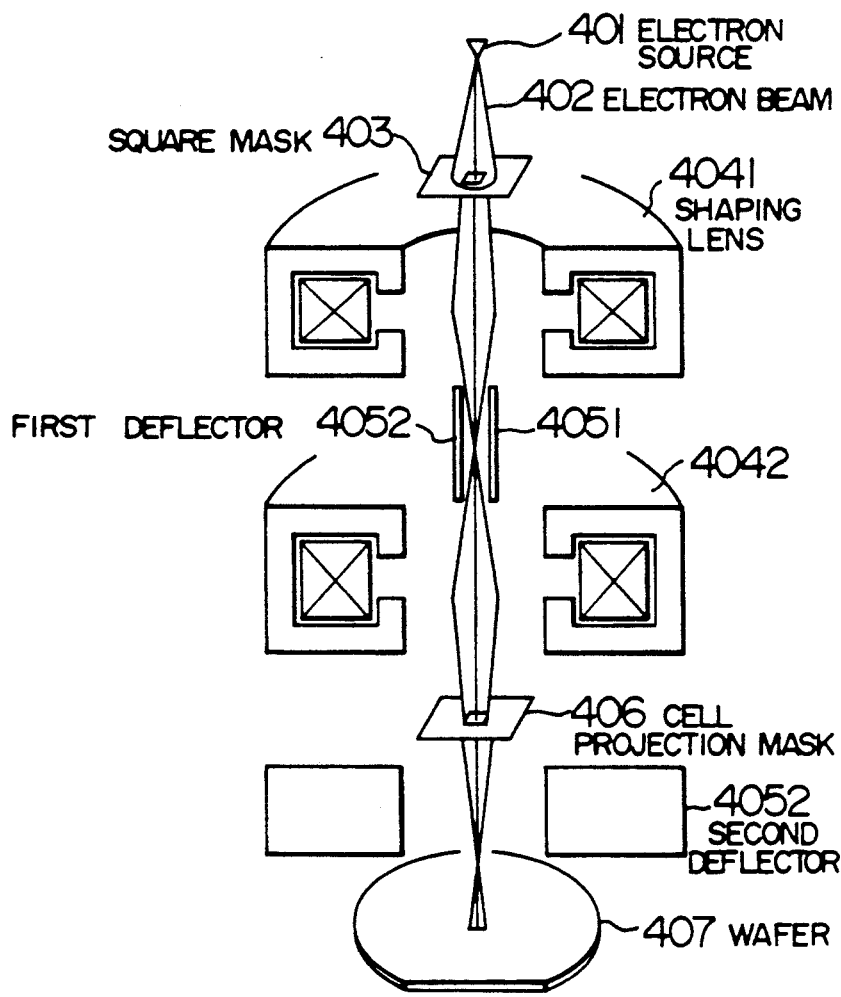
FIG. 40 is a schematic diagram of an arrangement of the prior art electron beam writing system.

FIG. 39 shows an example of the pattern arrangement of a cell projection mask 396 according to the present invention. FIG. 40 shows an arrangement of the ordinary electron beam writing system. The cell projection mask 396 includes a plurality of submasks 3914 each of which is composed of a square aperture 399 and a group of cell projection apertures 3910.

The square aperture 399 is used to form several square patterns including e.g. the bonding pad of an IC. Now, if the square beam 398 which is obtained by a square mask 403 is located at the position indicated by a dotted line in FIG. 39, the beam passes through the portion where the square aperture 399 overlaps with the square beam 398. Therefore, if the passed beam is deflected by a second deflector 4052 to be projected onto a wafer 407, the bonding pad, square pattern, etc. having any optional size can be formed at a predetermined position of the wafer 407. Also, if the square beam 398 is overlapped with each of the group of cell projection apertures, the patterns belonging to the group can be collectively selected to be projected on the wafer 407.

The feature of this embodiment resides in that the square aperture 399 is centrally located on the submask 3914 and the group of cell projection apertures 3910 are located around it. More specifically, in FIG. 39, the square aperture 399 is centrally located on the submask 3914 and a group of five cell projection apertures are located on the upper and right sides of it whereas no aperture is located on the lower and left sides thereof. Thus, in making the square pattern using the square aperture 399, as seen from the figure, the square beam 398 can be shifted to the left lower side of the submask 3814 to set the size of the above square pattern. As a result, the square beam 398 can be prevented from being leaked in and projected on the group of cell projection apertures 3910.

Further, since the square aperture 399 centrally located on the submask 3914 is adjacent to the group of cell projection apertures 3910 around it, the shifting distance of the square beam 398 is short. This shortens the deflection time of the beam to enhance the throughput.

Figure 41:
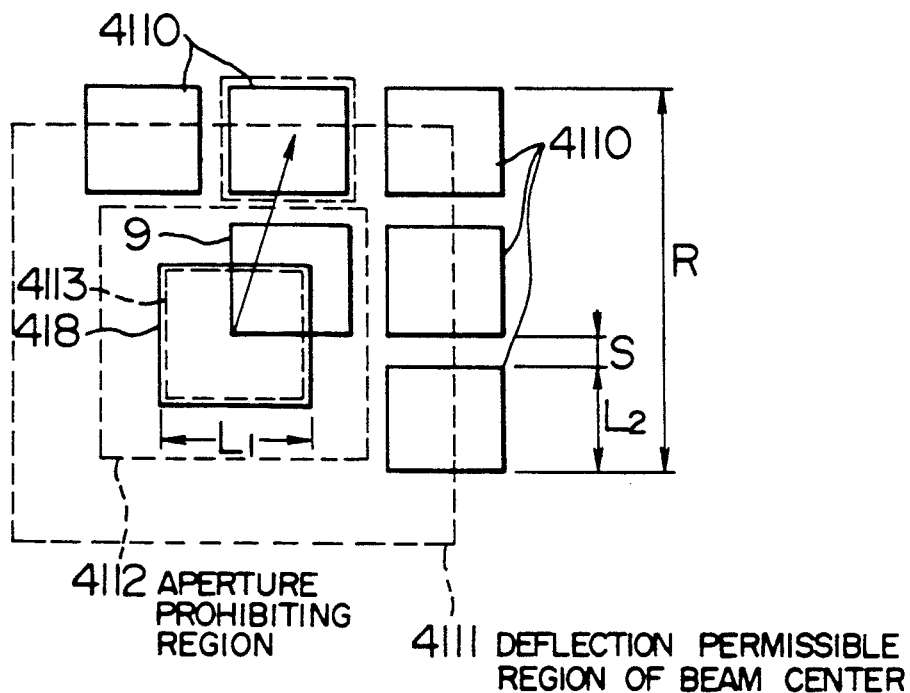
FIG. 41 is a plan view for explaining the relationship between the layout of each mask pattern for cell projection and a square beam.

FIG. 41 shows details of the position relation between the square aperture 399 and the group of cell projection apertures 3910. As seen from FIG. 41, the respective centers of five cell projection apertures 3910 are located so that they are not outside the region 4111 within which the center of the square beam 4111 can be deflected. Therefore, the arrangement length R of the group of cell projection apertures is shorter than the length of the side of the above region 4111. Further, located between the cell projection apertures 3910 are spaces S for preventing the beam from leaking or being scattered. The value of the spaces is determined considering the accelerating voltage of the electron beam, the material of the mask, etc.

In FIG. 41, 4113 is the deflection region of the beam center in the case where the square region is used. An aperture prohibiting region is determined in accordance with the region 4113. Namely, the group of cell projection apertures 3910 is allowed to be arranged outside the aperture prohibiting region 4113.

Assuming that the length of one side of the square aperture 399 is $L_1$ and that of one side of each aperture of the group of cell projection apertures 3910 is $L_2$, these dimensions should be determine in accordance with $$L_2 < L_1 < L_2 + S \qquad (4)$$

The number of the cell projection apertures 3910 was set for 5 in FIGS. 39 and 41. For example, in the case where memory cell patterns are to be projected, in most cases, the number of patterns required for cell projection including the inversion of the cell pattern or 90 degree rotation is 5 or less and also the deflection control of the square beam can be executed using two bits in the vertical and horizontal directions, respectively. Therefore, the value of 5 for the number is very reasonable. On the other hand, if the number N is larger than 5, the size of each of the cell projection apertures 3910 is required to be decreased and also the number of the spaces S is increased to reduce the using efficiency of space. Further, the number of shots increases in proportion to N to reduce the throughput.

Figure 42:
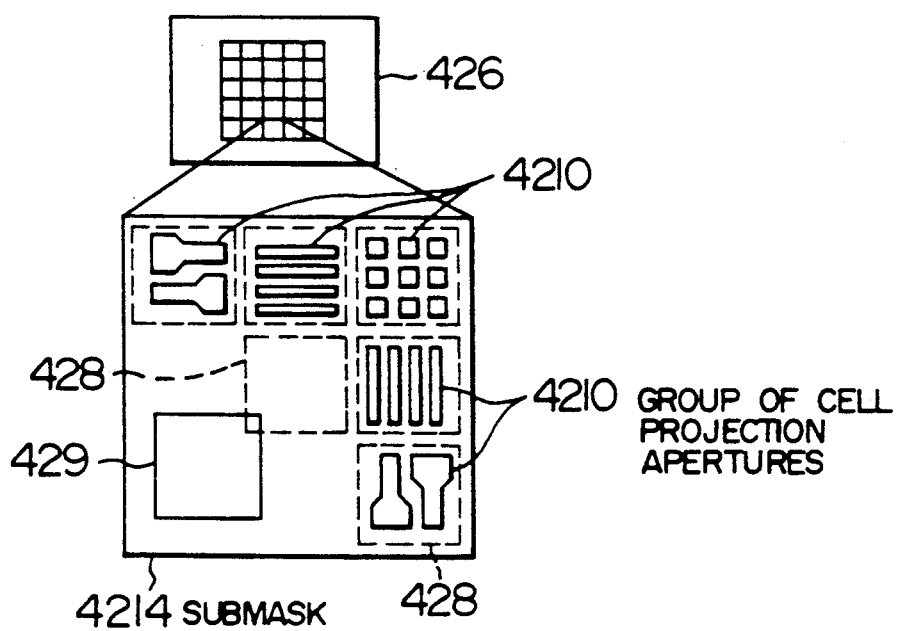
FIG. 42 is a plan view of another example of the mask pattern for cell projection according to the present invention.

FIG. 42 shows the other layout of a submask 4214 used in the present invention. As seen from FIG. 42, a square aperture 429 is arranged on the left lower side of the submask 4214 so that several kinds of square patterns can be formed with a square beam 428 being centrally located on the submask 4214 as shown in FIG. 42. Therefore, the distance by which the electron beam is to be shifted to cell projection apertures 4210 is decreased to enhance the throughput.

As shown in FIG. 39, the cell projection mask 396 includes a plurality of submasks 3914 arranged in a matrix shape. The patterns of these submasks are usually made different from one another to enhance the throughput; however, the submask(s) with a high frequency of use is likely to be polluted so that a plurality of submasks having the same pattern are arranged for backup.

In accordance with this embodiment, the distance between the square aperture located on the submask and the cell projection apertures located around it is relatively short so that the average shifting distance of the electron beam is also short thereby improving the throughput of the electron beam writing system.

Further, by setting the length of each side of the above square electron beam for the value which is larger than the length of two sides of each of the cell projection patterns but shorter than this length plus the spacing, it is possible to obviate the influence of scattering of the electron beam.

Further, by setting the number of the cell projection apertures included in the submask for 5, the masks corresponding to memory cells are accommodated within the submask and the average shifting distance of the square electron beam is minimized so that the throughput can be improved.

Furthermore, by providing the square aperture adjacent to the corner formed by two sides of the above submask, the average shifting distance of the electron beam can be further shortened to further improve the throughput.

We claim:

1. An electron beam writing system used in a cell projection method, comprising:
    means forming an electron beam;
    an aperture having at least one graphic for defining a shape of the electron beam;
    means for shaping the electron beam in a first predetermined amount of time, including means for passing the electron beam through a selected graphic of the aperture and for projecting the electron beam onto a writing plane; and
    deflector means for defining a writing position of the shaped electron beam on the writing plane in a predetermined second amount of time, wherein said second amount of time is at least as long as said first amount of time; and
    wherein said means for shaping the electron beam includes: a deflector as said means for passing the electron beam through a graphic of the aperture; means for redeflecting the shaped electron beam for correcting an original position of the selected graphic; means for correcting astigmatism of the shaped electron beam; and means for focusing the shaped electron beam for reducing a Coulomb effect by a correction factor depending on the selected graphic position on the aperture above an objective lens in the predetermined second amount of time.

2. An electron beam writing system used in a cell projection method, comprising:
    means forming an electron beam;
    an aperture having at least one graphic for defining a shape of the electron beam;
    means for shaping the electron beam in a first predetermined amount of time, including means for passing the electron beam through a selected graphic of the aperture and for projecting the electron beam onto a writing plane; and
    deflector means for defining a writing position of the shaped electron beam on the writing plane in a predetermined second amount of time, wherein said second amount of time is at least as long as said first amount of time, and wherein said deflector means includes a first deflector for defining at least one writing position that operates in an amount of time shorter than said first amount of time required to shape the electron beam, and a second deflector for defining another writing position that operates in an amount of time longer than said first amount of time.

3. An electron beam writing system used in a cell projection method, comprising:
    means forming an electron beam;
    an aperture having at least one graphic for defining a shape of the electron beam;
    means for shaping the electron beam in a first predetermined amount of time, including means for passing the electron beam through a selected graphic of the aperture and for projecting the electron beam onto a writing plane; and
    deflector means for defining a writing position of the shaped electron beam on the writing plane in a predetermined second amount of time, wherein said second amount of time is at least as long as said first amount of time, and wherein said deflector means includes first, second and third deflectors each having progressively longer deflection times, respectively, wherein the second deflector operates in an amount of time at least as long as said first amount of time.

4. A method of using an electron beam writing system in a cell graphic exposure method, comprising the steps of:
    forming an electron beam;
    shaping the electron beam in a first predetermined amount of time, including deflecting the electron beam through a selected graphic of an aperture having plural graphics and projecting the electron beam onto a writing plane;

executing concurrently with said step of deflecting at least one of astigmatism correction of the selected graphic and focus correction of the electron beam for reducing the Coulomb effect within said predetermined amount of time.

5. A method of using an electron beam writing system in a cell graphic exposure method, comprising the steps of:

forming an electron beam;

shaping the electron beam, including deflecting the electron beam through a selected graphic of an aperture having plural graphics and projecting the electron beam onto a writing plane;

correcting for deflection distortion occurring in said deflecting by a correction value;

changing the correction value in accordance with the selected graphic, wherein the correcting is performed in the time during which the graphic is selected for the projecting on the writing plane.

6. An electron beam writing method according to claim 4, wherein the amount of focus correction for reducing the Coulomb effect is determined in accordance with an aperture rate of the selected graphic.

7. An electron beam writing method according to claim 5, further comprising the steps of:

using a deflection lens for said deflecting;

calibrating the deflection lens using two kinds of reference apertures with different aperture rates, respectively; and during writing with the electron beam, determining a correction coefficient of the deflection distortion by polynomial approximation of the aperture rate according to aperture rates of the reference apertures.

8. An electron beam writing method according to claim 6, wherein the aperture rate is estimated in accordance with one of back-scattered electrons, secondary electrons and light or current flowing through the aperture obtained by projecting electrons onto the selected graphic.

9. An electron beam writing method according to claim 6, further comprising a step of fabricating a miniaturized device selected from a semiconductor device, an integrated circuit, a magnetic disk and an optical disk.

10. In a method of using an electron beam writing system according to claim 4, further comprising a step of fabricating a miniaturized device selected from a semiconductor device, an integrated circuit, a magnetic disk and an optical disk.

* * * * *